United States Patent
Mauk et al.

(10) Patent No.: US 9,441,846 B2
(45) Date of Patent: Sep. 13, 2016

(54) HVAC UNIT, A METHOD OF GENERATING A NETWORK ADDRESS FOR A HVAC UNIT AND A HVAC CONTROLLER THEREFOR

(75) Inventors: Richard A. Mauk, Lewisville, TX (US); John P. Stachler, Plano, TX (US)

(73) Assignee: Lennox Industries Inc., Richardson, TX (US)

( * ) Notice: Subject to any disclaimer, the term of this patent is extended or adjusted under 35 U.S.C. 154(b) by 465 days.

(21) Appl. No.: 12/694,433

(22) Filed: Jan. 27, 2010

(65) Prior Publication Data

US 2010/0295700 A1    Nov. 25, 2010

Related U.S. Application Data

(60) Provisional application No. 61/180,405, filed on May 21, 2009.

(51) Int. Cl.

| | |
|---|---|
| *G05B 23/02* | (2006.01) |
| *F24F 11/00* | (2006.01) |
| *G05B 13/02* | (2006.01) |
| *G05B 13/00* | (2006.01) |
| *G01R 21/133* | (2006.01) |
| *G06Q 50/06* | (2012.01) |
| *G01D 4/00* | (2006.01) |
| *G01R 21/127* | (2006.01) |
| *G01R 21/00* | (2006.01) |
| *H02P 25/04* | (2006.01) |
| *H01R 13/645* | (2006.01) |

(Continued)

(52) U.S. Cl.
CPC ............ *F24F 11/0009* (2013.01); *G01D 4/00* (2013.01); *G01R 21/00* (2013.01); *G01R 21/127* (2013.01); *G01R 21/133* (2013.01); *G01R 21/1335* (2013.01); *G05B 13/00* (2013.01); *G05B 13/02* (2013.01); *G05B 15/02* (2013.01); *G05B 19/042* (2013.01); *G05D 23/1393* (2013.01); *G06Q 50/06* (2013.01); *H01R 13/6456* (2013.01); *H01R 23/7073* (2013.01); *H02P 25/04* (2013.01); *G05B 2219/2614* (2013.01); *H02J 2003/143* (2013.01); *H02J 2003/146* (2013.01); *Y02B 70/3216* (2013.01); *Y02B 70/3225* (2013.01); *Y02B 70/3233* (2013.01); *Y02B 70/3241* (2013.01); *Y02B 70/3275* (2013.01); *Y04S 20/221* (2013.01); *Y04S 20/222* (2013.01); *Y04S 20/224* (2013.01); *Y10T 29/49* (2015.01); *Y10T 29/4935* (2015.01); *Y10T 29/49117* (2015.01); *Y10T 29/49147* (2015.01); *Y10T 29/49359* (2015.01); *Y10T 29/49826* (2015.01); *Y10T 307/713* (2015.04)

(58) Field of Classification Search
CPC .................................................. F24F 2011/0072
USPC ........................................................ 340/3.53
See application file for complete search history.

(56) References Cited

U.S. PATENT DOCUMENTS

| | | | | |
|---|---|---|---|---|
| 4,130,874 A | * | 12/1978 | Pai .......................... | H04Q 9/14 307/31 |
| 5,751,948 A | * | 5/1998 | Dolan ..................... | H04L 29/06 714/52 |

(Continued)

*Primary Examiner* — Naomi Small
(74) *Attorney, Agent, or Firm* — Baker Botts L.L.P.

(57) ABSTRACT

An HVAC controller, a method for operating a HVAC unit and a HVAC unit are disclosed herein. In one embodiment, the HVAC controller includes: (1) a memory configured to store a unique default network address for the controller and (2) a processor configured to automatically generate the unique default network address based on a seed value that is uniquely associated with the HVAC unit.

20 Claims, 3 Drawing Sheets

(51) Int. Cl.
  *H01R 12/50*  (2011.01)
  *G05B 19/042* (2006.01)
  *G05D 23/13*  (2006.01)
  *G05B 15/02*  (2006.01)
  *H02J 3/14*   (2006.01)

(56) References Cited

U.S. PATENT DOCUMENTS

| | | | | |
|---|---|---|---|---|
| 5,787,027 A * | 7/1998 | Dolan | | G05D 23/1917 |
| | | | | 236/49.3 |
| 5,818,347 A * | 10/1998 | Dolan | | F24F 11/006 |
| | | | | 236/2 |
| 5,927,398 A * | 7/1999 | Maciulewicz | | F24F 11/006 |
| | | | | 165/208 |
| 7,557,696 B2 * | 7/2009 | Brinton | | G08G 1/20 |
| | | | | 235/380 |
| 7,761,568 B1 * | 7/2010 | Levi | | H04W 4/02 |
| | | | | 709/217 |
| 7,996,561 B2 * | 8/2011 | Lee | | H04L 29/12254 |
| | | | | 370/255 |
| 2002/0112070 A1 * | 8/2002 | Ellerbrock | | H04L 12/403 |
| | | | | 709/238 |
| 2003/0028649 A1 * | 2/2003 | Uhlik | | H04W 76/021 |
| | | | | 709/228 |
| 2003/0137396 A1 * | 7/2003 | Durej | | G05B 15/02 |
| | | | | 340/3.5 |
| 2004/0194484 A1 * | 10/2004 | Zou | | F24F 3/0442 |
| | | | | 62/186 |
| 2007/0113186 A1 * | 5/2007 | Coles | | G06F 9/4411 |
| | | | | 715/735 |
| 2007/0162615 A1 * | 7/2007 | Rusu | | H04L 29/12254 |
| | | | | 709/245 |
| 2008/0097782 A1 * | 4/2008 | Budike, Jr. | | G01D 4/004 |
| | | | | 705/63 |
| 2008/0204313 A1 * | 8/2008 | Petrisor | | G04G 15/006 |
| | | | | 342/357.75 |
| 2009/0009298 A1 * | 1/2009 | Brissman | | G05B 19/042 |
| | | | | 340/10.51 |
| 2009/0116659 A1 * | 5/2009 | Moeller | | H04S 3/02 |
| | | | | 381/73.1 |
| 2009/0261767 A1 * | 10/2009 | Butler | | F04D 27/004 |
| | | | | 318/445 |
| 2010/0110077 A1 * | 5/2010 | Grossman | | G06Q 10/06 |
| | | | | 345/440 |

\* cited by examiner

HVAC UNIT, A METHOD OF GENERATING A NETWORK ADDRESS FOR A HVAC UNIT AND A HVAC CONTROLLER THEREFOR

CROSS-REFERENCE TO RELATED APPLICATION

This application claims the benefit of U.S. Provisional Application Ser. No. 61/180,405, filed by Mark Beste, et al., on May 21, 2009, entitled "Comprehensive HVAC Control System," and incorporated herein by reference in its entirety.

TECHNICAL FIELD

This application is directed, in general, to heating, ventilating and air conditioning (HVAC) systems and, more specifically, to automatically setting parameters that are used in the operation of HVAC units.

BACKGROUND

HVAC systems can be used to regulate the environment within an enclosed space. Typically, an air blower is used to pull air from the enclosed space into the HVAC system through ducts and push the air back into the enclosed space through additional ducts after conditioning the air (e.g., heating, cooling or dehumidifying the air). Various types of HVAC systems, such as roof top units, may be used to provide conditioned air for enclosed spaces.

At a particular site, multiple HVAC units may be used to provide conditioned air for an enclosed space. For example, one building may employ multiple rooftop units to provide conditioned air. Often each of the HVAC units may be coupled to a communications network that allows, for example, the downloading of updates, communicating between other HVAC units, verifying of commission, verifying of service, remote monitoring or remote managing. For reliable communications, each HVAC unit needs a network address that comports with the communications network that is being used. The network address allows directed communication to the controller of each HVAC unit. Often, to insure proper communication, each HVAC controller may need to be manually programmed with a network address that complies with the communications network that is being used.

In addition to needing a network address, the HVAC controllers may also need battery back-up to maintain operation when power is lost. Without battery back-up or another type of back-up power source, the HVAC controllers may be unable to maintain the current date and current time following a system reset. As such, the HVAC controllers may not be able to determine the current date and time at start-up of each HVAC unit.

SUMMARY

In one aspect, an HVAC controller is disclosed that includes: (1) a memory configured to store a unique default network address for the controller and (2) a processor configured to automatically generate the unique default network address based on a seed value that is uniquely associated with the HVAC unit.

In another aspect, a method for operating a HVAC unit is disclosed. In one embodiment, the method includes: (1) obtaining, employing a controller of the HVAC unit, a seed value for a unique default network address for the controller, the seed value uniquely associated with the HVAC unit, (2) automatically generating, employing a controller of the HVAC unit, the unique default network address for the controller based on the seed value and (3) storing the unique default network address in a memory associated with the controller.

In yet another aspect, a HVAC system is provided. In one embodiment, the HVAC system includes: (1) a network transceiver configured to transmit and receive HVAC data associated with the HVAC unit over a communications network and (2) a controller to direct operation of the HVAC unit, the controller having (2A) a memory configured to store a unique default network address for the controller for communicating over the communications network and (2B) a processor configured to automatically generate the unique default network address based on a seed value that is uniquely associated with the HVAC unit.

BRIEF DESCRIPTION

Reference is now made to the following descriptions taken in conjunction with the accompanying drawings, in which.

DETAILED DESCRIPTION

Figure 1:
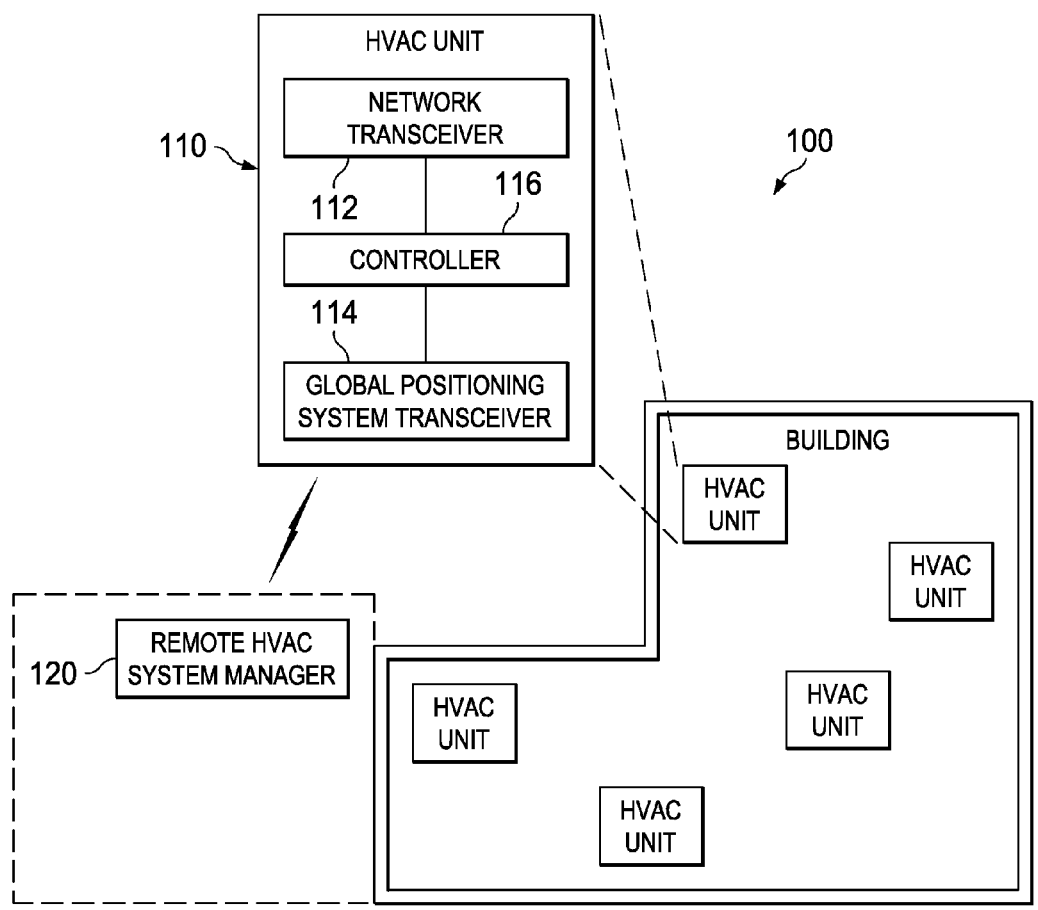
FIG. 1 is a block diagram of an embodiment of a HVAC system constructed according to the principles of the disclosure.

This disclosure provides embodiments for determining parameters, such as a default network address, that are used in the remote operation of HVAC units. As disclosed in certain embodiments herein, an HVAC controller may be used to generate the default network address for the HVAC units. Typically, in conventional HVAC systems, a technician manually assigns and enters such parameters for each HVAC unit, which increases installation time, costs, and the possibility of that an erroneous network address might be entered. In contrast, the embodiments as provided herein provide a HVAC controller that automatically determines the default network address. By employing the HVAC controller to determine the parameters, installation time, cost, and errors may be reduced.

In one embodiment of this disclosure, the HVAC controller may generate a unique network address for an HVAC unit. In aspect of this embodiment, the HVAC controller may employ a Global Positioning System (GPS) to automatically determine the unique network address. A GPS transceiver located with the HVAC unit may be used to provide GPS coordinates that are used by the HVAC controller to generate the unique network address. In another embodiment, an HVAC controller may use a unique number associated with the HVAC unit to generate the unique network address. The unique number may be, for example, a serial number of the controller or a serial number for the HVAC unit.

The GPS coordinates and the unique number are examples of a seed value. A seed value may be used by the HVAC controller to generate a parameter such as the unique network address. A seed value is a number or a collection of numbers that is uniquely associated with an HVAC unit. In some embodiments, the seed value may be an alphanumeric value.

The unique network address that is generated can be stored in a memory associated with the HVAC controller for later retrieval. The unique network address that is generated is compliant with the communications network that is being used by the HVAC unit. The unique network address may be retrieved to be reconfigured in keeping with an address scheme that is chosen for a particular installation.

In addition to using GPS data to generate parameters, such as, a unique network address, the GPS data may also be used to determine the current date and current time. The HVAC controller may use the time information included in the GPS data to calculate the current date and current time. By maintaining the current date and time via the GPS data, the HVAC unit may not require a back-up power source such as a battery. Thus, even without a battery back-up, the disclosed HVAC controllers can provide the current date and time at each start-up of the HVAC unit via the GPS data. The communications network may be used to report the current date and time at each start-up.

The HVAC controller for each HVAC unit is configured to direct the operation thereof. As such, the HVAC controller is configured to provide control functionality beyond the scope of the present disclosure. Typically, each HVAC unit will include a designated controller. The HVAC controller may be one or more electric circuit boards including at least one microprocessor or micro-controller integrated circuit. The HVAC controller also includes the support circuitry for power, signal conditioning, and associated peripheral devices. In addition to a processor, the HVAC controller may include a memory having a program or series of operating instruction (i.e., firmware or software) that executes in such a way as to implement at least some of the features described herein when initiated by the processor.

FIG. 1 is a block diagram of an embodiment of a HVAC system 100 constructed according to the principles of the disclosure. The HVAC system 100 includes multiple HVAC units at a single site. In FIG. 1, the site is a building and the HVAC units are rooftop units. One skilled in the art will understand that the type of HVAC units in the HVAC system 100 may vary. Additionally, each of the HVAC units may be the same type (i.e., model) of HVAC unit or there may be different types of HVAC units within the HVAC system 100. The multiple HVAC units of the HVAC system 100 are represented by HVAC unit 110. As such, the following discussion regarding the HVAC unit 110 may also apply to each of the other multiple HVAC units. The HVAC system 100 also includes a Remote HVAC system manager 120.

The HVAC unit 110 includes a network transceiver 112, a GPS transceiver 114 and a HVAC controller 116. The network transceiver 112 and the GPS transceiver 114 are coupled to the HVAC controller 116. The network transceiver 112 and the GPS transceiver 114 may be conventional devices. The network transceiver 112 is configured to transmit and receive HVAC data associated with the HVAC unit over a communications network. The communications network may be the Internet. In some embodiments, the communications network may be specific for HVAC systems. For example, the communications network may employ the BACnet® (Building Automation and Control Networks) data communication protocol associated with the American Society of Heating, Refrigerating and Air-Conditioning Engineers (ASHRAE). Alternatively, the communications network may employ the LonTalk® protocol from the Echelon Corporation of San Jose, Calif.

The GPS transceiver 114 is configured to process GPS signals received from GPS satellites and send GPS data based thereon to the HVAC controller 116. The GPS data includes coordinate information (i.e., latitude, longitude and altitude), date and time. The GPS transceiver 114 is unique to the HVAC unit 110.

One skilled in the art will also understand that the HVAC unit 110 may include heating, cooling and blower (HCB) components that are typically included in a HVAC unit. The HCB components are not presently illustrated or discussed but are typically included in an HVAC unit, such as, a compressor, an indoor air blower, an outdoor fan and an electrical heating element. Typical components may also include a power supply, an expansion valve, a temperature sensor, etc. The various components of the HVAC unit 110 may be contained within a single enclosure (e.g., a cabinet). The HVAC controller 116 is configured to direct the operation of the various HCB components.

The HVAC controller 116 includes a memory configured to store a unique default network address for the controller for communicating over communications network via the network transceiver 112. The HVAC controller 116 also includes a processor configured to automatically generate the unique default network address based on a seed value that is uniquely associated with the HVAC unit 110. In one embodiment, the seed value is based on a serial number associated with the HVAC unit. In another embodiment, the seed value is based on the GPS data received from the GPS transceiver 114. The processor may also be configured to employ the GPS data to determine a current date and a current time for the controller 116. The memory and processor are not illustrated in FIG. 1. However, FIG. 2 provides more detail of an HVAC controller constructed according to the disclosure.

The Remote HVAC system manager 120 may be located away from the site or from the HVAC unit 120. For example, the Remote HVAC system manager 120 may be located at a HVAC contractor's office or even within the building (illustrated with the dashed lines) at a maintenance supervisor's office. Accordingly, the Remote HVAC system manager 120 may receive various data from the controller 116 over the communications network via the network transceiver 112. As illustrated, a wireless connection may be used to couple the HVAC system manager 120 to the HVAC unit 120.

The Remote HVAC system manager 120 may be a general computing device having a memory and a processor wherein the memory includes a series of operating instructions that are used to direct the processor when initiated thereby. In one embodiment, the Remote HVAC system manager 120 may be a dedicated computing device having the necessary hardware, firmware, software or a combination thereof to perform the designated operations disclosed herein.

Figure 2:
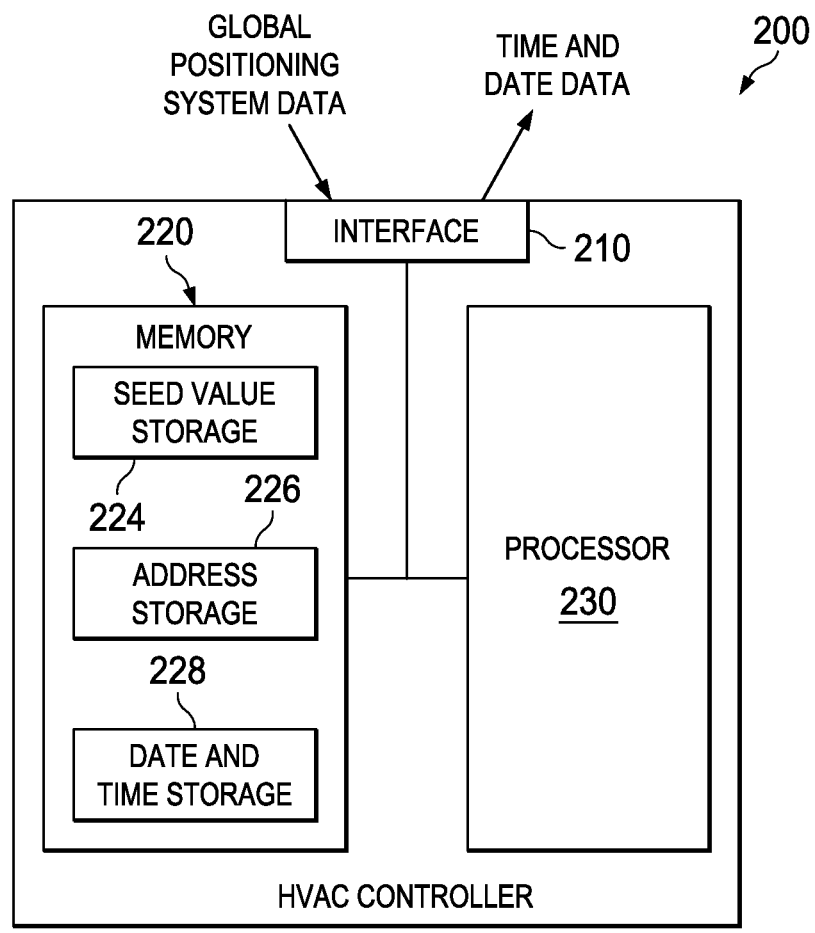
FIG. 2 is a diagram of an embodiment of a HVAC controller constructed according to the principles of the disclosure.

FIG. 2 is a diagram of an embodiment of a HVAC controller 200 constructed according to the principles of the disclosure. The HVAC controller 200 includes an interface 210, a memory 220 and a processor 230. The HVAC controller 200 is configured to direct the operation of a HVAC unit, such as a rooftop HVAC unit. The HVAC controller 200 may also include additional components typically included within a controller for a HVAC unit, such as a power supply or power port.

The interface 210 may be a conventional interface that is used to receive and transmit data for a controller, such as a microcontroller. The interface 210 is configured to receive GPS data from a GPS transceiver associated with the HVAC unit. The GPS data includes unique GPS coordinates for the HVAC unit from the GPS transceiver. In some embodiments, the location data may be from a receiver of another type of location system.

The interface 210 may be a conventional device for transmitting and receiving data and may include multiple ports for transmitting and receiving data. The ports may be conventional receptacles for communicating data via various means such as, a portable memory device, a PC or a portable computer or a communications network. The interface 210 may be coupled to a network transceiver or a GPS transceiver to provide communication between the transceivers and the HVAC controller 200. The interface 210 is also coupled to the memory 220.

The memory 220 is coupled to the interface 210 and is configured to store a unique default network address for the HVAC controller 200. The memory 220 may be a conventional memory typically located within a microcontroller that is constructed to store data and computer programs. The memory 220 may store operating instructions to direct the operation of the processor 230 when initiated thereby. The unique default network address may be stored in a dedicated location of the memory.

The processor 230 may be a conventional processor such as a microprocessor. The processor 230 is configured to automatically generate the unique default network address based on a seed value that is uniquely associated with the HVAC unit. The processor 230 is configured to generate the unique default network address such that it complies with a network address scheme of the communications network employed by the HVAC unit. The seed value used by the processor 230 may be obtained from received GPS data. Alternatively, the seed value may be based on a serial number associated with the HVAC unit. For example, the seed value may be the serial number of the HVAC controller. The seed value may be stored in a dedicated location of the memory 220 such as seed value storage 224. The unique default network address may also be stored in the memory 220 at a dedicated location such as address storage 226. As such, the unique default network address may be stored in the address storage 226 and used for communication. The unique default network address may also be reconfigured after installation of the HVAC unit. As such, the unique default network address can be changed to comply with an address scheme that is being used at a particular installation site.

The processor 230 is further configured to employ the GPS data to determine a current date and a current time for the HVAC controller 200. The processor 230 may maintain the current date and time at a dedicated memory location, date and time storage 228, of the memory 220. The processor 230 may obtain the date and time information from the GPS data multiple times during normal operation of the HVAC unit. The date and time information may be obtained at dedicated intervals. In some embodiments, the date and time information may be obtained periodically. The processor 230 may note the current date and time at each start-up of the HVAC unit. By employing the time information from the GPS data, the HVAC controller 200 may reduce or eliminate back-up battery power needed therefor. The processor 230 may send the current date and time information to a Remote HVAC system manager over a communications network via the interface 210. In some embodiments, the processor 230 may direct the date and time information be downloaded to a portable memory or a portable computing device via the interface 210.

As noted, the processor 230 can provide a unique default network address for the HVAC controller 200 that complies with an address scheme used by the communications network employed by the HVAC unit. Some networks are limited to addresses 1-32 due to software or hardware design. Other networks may accept more address numbers, but may limit the total number of devices on the network. To insure proper operation, each of the devices on a network needs a unique address. In one embodiment, the processor 230 may not need to manipulate the seed value to obtain a compliant and unique network address. In some embodiments, the processor 230 is configured to manipulate the seed value to obtain a compliant and unique network address. An algorithm or formula may be used to obtain a compliant and unique network address. For example, consider the seed value is a serial number. The unique default network address may be calculated by the following equation:

Address=(2*one's digit of the serial number (0-9))+
(1.5*ten's digit of the serial number (0-9))+
(hundred's digit of the serial number (0-9))+3.

If a whole number is not obtained, the calculated address value can either be rounded-up or rounded-down.

The processor 230 may use other equations to determine the unique default network address based on such factors as the type of communications system used, the number of HVAC units in the network, form of serial numbers used, etc.

Figure 3:
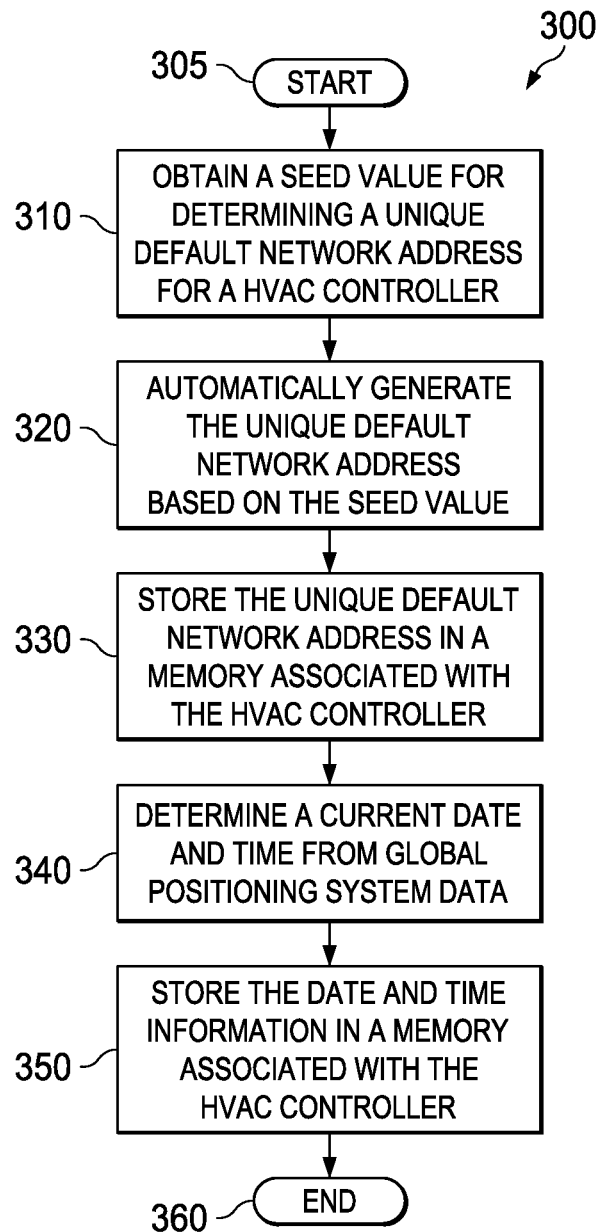
FIG. 3 is a flow diagram of an embodiment of a method for operating a HVAC unit carried out according to the principles of the disclosure.

FIG. 3 is a flow diagram of an embodiment of a method 300 for operating a HVAC unit carried out according to the principles of the disclosure. The HVAC unit may be a rooftop unit that includes a refrigeration circuit, an indoor air blower system an outdoor fan system and a heating element. An HVAC controller such as described with respect to FIG. 1 or FIG. 2 may be used to perform the method 300. A portion of the method 300 may represent an algorithm that is stored on a computer readable medium, such as a memory of an HVAC controller (e.g., the memory 220 of FIG. 2) as a series of operating instructions that can direct the operation of a processor (e.g., the processor 230 of FIG. 2). The method 300 begins in a step 305.

In a step 310, a seed value for determining a unique default network address for a controller of the HVAC unit is obtained. The seed value may be obtained via an interface of the HVAC controller of a memory of the HVAC controller. In one embodiment, the seed value may be obtained from GPS data from a GPS transceiver located with the HVAC unit. In another embodiment, the seed value may be a serial number associated with the HVAC controller. For example, the serial number may be the serial number for the HVAC controller itself and it may be stored in the memory of the HVAC controller.

The unique default network address is automatically generated by the HVAC controller based on the seed value in a step 320. The HVAC controller may manipulate the unique default network address to comply with a network address scheme of a communications network employed by the HVAC unit.

In a step 330, the unique default network address is stored in a memory associated with the HVAC controller. The memory may be a memory of the HVAC controller. The stored unique default network address may remain accessible to be reconfigured after installation of the HVAC unit to comply with an addressing scheme used at the installation site.

A current date and current time for the HVAC controller may also be determined from the GPS data in a step 340. The HVAC controller may determine the date and time multiple times during normal operation of the HVAC unit. In a step 350, the date and time information is stored in the memory associated with the HVAC controller. As such, the HVAC controller may maintain the date and time for the HVAC controller via the GPS data. The method 300 then ends in a step 360.

The above-described methods or at least portions thereof may be embodied in or performed by various conventional digital data processors, microprocessors or computing devices, wherein these devices are programmed or store executable programs of sequences of software instructions to perform one or more of the steps of the methods, e.g., steps of the method of FIG. 3. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computing devices to perform one, multiple or all of the steps of one or more of the above-described methods, e.g., one or more of the steps of the method of FIG. 3. Additionally, an apparatus, such as dedicated HVAC controller, may be designed to include the necessary circuitry to perform or direct the performance of steps of the methods of FIG. 3.

Those skilled in the art to which this application relates will appreciate that other and further additions, deletions, substitutions and modifications may be made to the described embodiments.

What is claimed is:

1. A controller of a heating, ventilating and air conditioning (HVAC) unit, comprising:
   a memory comprising operating instructions; and
   a processor configured, when executing the operating instructions, to:
   receive global positioning system (GPS) data from a GPS transceiver coupled to said HVAC unit;
   generate a seed value based on said GPS data;
   automatically generate a unique default network address for said controller based on the seed value, wherein said unique default network address is generated using a function of said seed value;
   store the unique default network address in the memory; and
   reconfigure the stored unique default network address to comply with an address scheme of an installation site of said HVAC unit.

2. The HVAC controller as recited in claim 1 wherein generating said seed value is further based on a serial number associated with said HVAC unit.

3. The HVAC controller as recited in claim 1 wherein said unique default network address complies with a network address scheme of a communications network employed by said HVAC unit.

4. The HVAC controller as recited in claim 1 wherein said processor is further configured, when executing the operating instructions, to determine a current date and a current time for said controller based on said GPS data.

5. The HVAC controller as recited in claim 1 wherein said function includes at least one coefficient.

6. The HVAC controller as recited in claim 5 wherein the at least one coefficient is associated with at least one digit of said seed value.

7. The HVAC controller as recited in claim 5 wherein the at least one coefficient includes different coefficients for at least two digits of said seed value.

8. A method for operating a heating, ventilating and air conditioning (HVAC) unit, comprising:
   receiving global positioning system (GPS) data from a GPS transceiver coupled to said HVAC unit;
   generating a seed value based on said GPS data;
   automatically generating, using a controller of said HVAC unit, a unique default network address for said controller based on said seed value, wherein said unique default network address is generated using a function of said seed value;
   storing said unique default network address in a memory associated with said controller; and
   reconfiguring the stored unique default network address to comply with an address scheme of an installation site of said HVAC unit.

9. The method as recited in claim 8 wherein generating said seed value is further based on a serial number associated with said HVAC unit.

10. The method as recited in claim 8 further comprising comporting said unique default network address to a network address scheme of a communications network employed by said HVAC unit.

11. The method as recited in claim 8 further comprising determining a current date and a current time for said controller based on said GPS data.

12. The method as recited in claim 8 wherein said function includes at least one coefficient.

13. The method as recited in claim 12 wherein the at least one coefficient is associated with at least one digit of said seed value.

14. The method as recited in claim 12 wherein the at least one coefficient includes different coefficients for at least two digits of said seed value.

15. A heating, ventilating and air conditioning (HVAC) unit, comprising:
    heating, cooling or blowing components;
    a network transceiver configured to transmit and receive HVAC data associated with said HVAC unit over a communications network;
    a global positioning system (GPS) transceiver; and
    a controller to direct operation of said heating, cooling or blowing components, said controller located with said HVAC unit and including:
    a memory comprising operating instructions; and
    a processor configured, when executing the operating instructions, to:
    receive GPS data from said GPS transceiver;
    generate a seed value based on said GPS data;
    automatically generate a unique default network address for said controller based on said seed value, wherein said unique default network address is generated using a function of said seed value;
    store the unique default network address in the memory; and
    reconfigure the stored unique default network address to comply with an address scheme of an installation site of said HVAC unit.

16. The HVAC unit as recited in claim 15 wherein generating said seed value is further based on a serial number associated with said HVAC unit.

17. The HVAC unit as recited in claim 15 wherein said processor is further configured, when executing the operating instructions, to determine a current date and a current time for said controller based on said GPS data.

18. The HVAC unit as recited in claim 15 said function includes at least one coefficient.

19. The HVAC unit as recited in claim 18 wherein the at least one coefficient is associated with at least one digit of said seed value.

20. The HVAC unit as recited in claim 18 wherein the at least one coefficient includes different coefficients for at least two digits of said seed value.

\* \* \* \* \*